United States Patent
Yuan et al.

(10) Patent No.: US 12,408,387 B2
(45) Date of Patent: *Sep. 2, 2025

(54) TRANSISTOR WITH A NEGATIVE CAPACITANCE AND A METHOD OF CREATING THE SAME

(71) Applicant: Taiwan Semiconductor Manufacturing Co., Ltd., Hsinchu (TW)

(72) Inventors: Feng Yuan, Hsinchu (TW); Ming-Shiang Lin, Hsinchu (TW); Chia-Cheng Ho, Hsinchu (TW); Jin Cai, Hsinchu (TW); Tzu-Chung Wang, Hsinchu (TW); Tung Ying Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 672 days.

This patent is subject to a terminal disclaimer.

(21) Appl. No.: 17/836,852

(22) Filed: Jun. 9, 2022

(65) Prior Publication Data

US 2022/0302315 A1 Sep. 22, 2022

Related U.S. Application Data

(63) Continuation of application No. 16/874,526, filed on May 14, 2020, now Pat. No. 11,387,360, which is a
(Continued)

(51) Int. Cl.
*H10D 30/69* (2025.01)
*H10D 30/01* (2025.01)
(Continued)

(52) U.S. Cl.
CPC ........ *H10D 30/701* (2025.01); *H10D 30/024* (2025.01); *H10D 30/0415* (2025.01);
(Continued)

(58) Field of Classification Search
CPC ... H10D 30/024–0245; H10D 30/0415; H10D 30/62–6219; H10D 30/701
See application file for complete search history.

(56) References Cited

U.S. PATENT DOCUMENTS 10,707,347 B2 7/2020 Yuan et al.
10,720,505 B2 7/2020 Then et al.
(Continued)

FOREIGN PATENT DOCUMENTS

CN 101983422 A 3/2011
CN 108122909 A 6/2018
(Continued)

*Primary Examiner* — Daniel P Shook
(74) *Attorney, Agent, or Firm* — Seed Intellectual Property Law Group LLP

(57) ABSTRACT

The various described embodiments provide a transistor with a negative capacitance, and a method of creating the same. The transistor includes a gate structure having a ferroelectric layer. The ferroelectric layer is formed by forming a thick ferroelectric film, annealing the ferroelectric film to have a desired phase, and thinning the ferroelectric film to a desired thickness of the ferroelectric layer. This process ensures that the ferroelectric layer will have ferroelectric properties regardless of its thickness.

20 Claims, 10 Drawing Sheets

Related U.S. Application Data continuation of application No. 16/255,334, filed on Jan. 23, 2019, now Pat. No. 10,707,347.

(60) Provisional application No. 62/748,789, filed on Oct. 22, 2018.

(51) Int. Cl.
  *H10D 30/62* (2025.01)
  *H10D 64/68* (2025.01)
  *H10D 84/01* (2025.01)
  *H10D 84/03* (2025.01)

(52) U.S. Cl.
  CPC ....... *H10D 30/6211* (2025.01); *H10D 64/689* (2025.01); *H10D 84/0144* (2025.01); *H10D 84/0158* (2025.01); *H10D 84/038* (2025.01)

(56) References Cited

U.S. PATENT DOCUMENTS

| | | |
|---|---|---|
| 11,387,360 B2 * | 7/2022 | Yuan ................. H10D 84/0144 |
| 2016/0155748 A1 | 6/2016 | Li et al. |
| 2017/0358684 A1 | 12/2017 | Chen et al. |
| 2018/0151745 A1 | 5/2018 | Chang et al. |
| 2018/0166448 A1 | 6/2018 | Cheng et al. |
| 2019/0097061 A1 | 3/2019 | Ho et al. |

FOREIGN PATENT DOCUMENTS

| | | |
|---|---|---|
| TW | 201803121 A | 1/2018 |
| TW | 201818507 A | 5/2018 |

\* cited by examiner

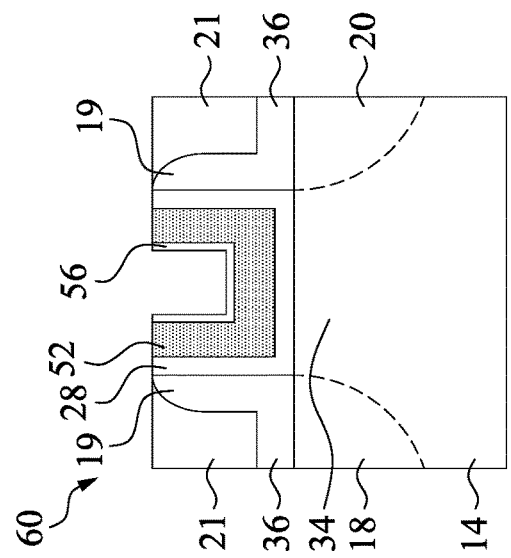
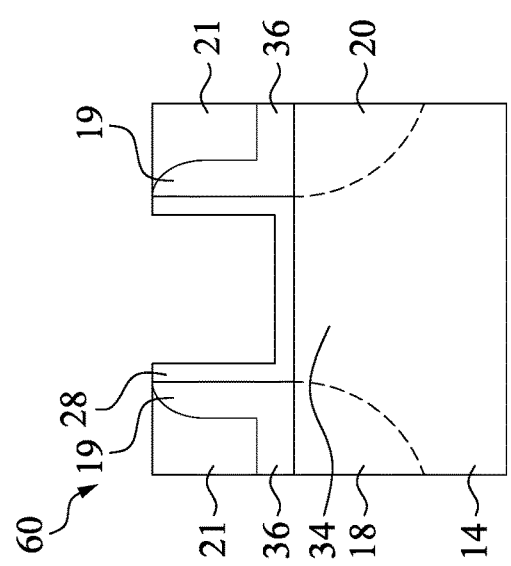
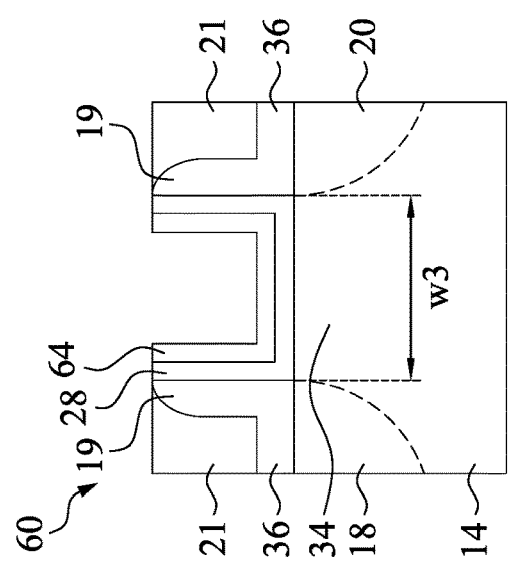
Fig. 5C
Fig. 5B
Fig. 5A

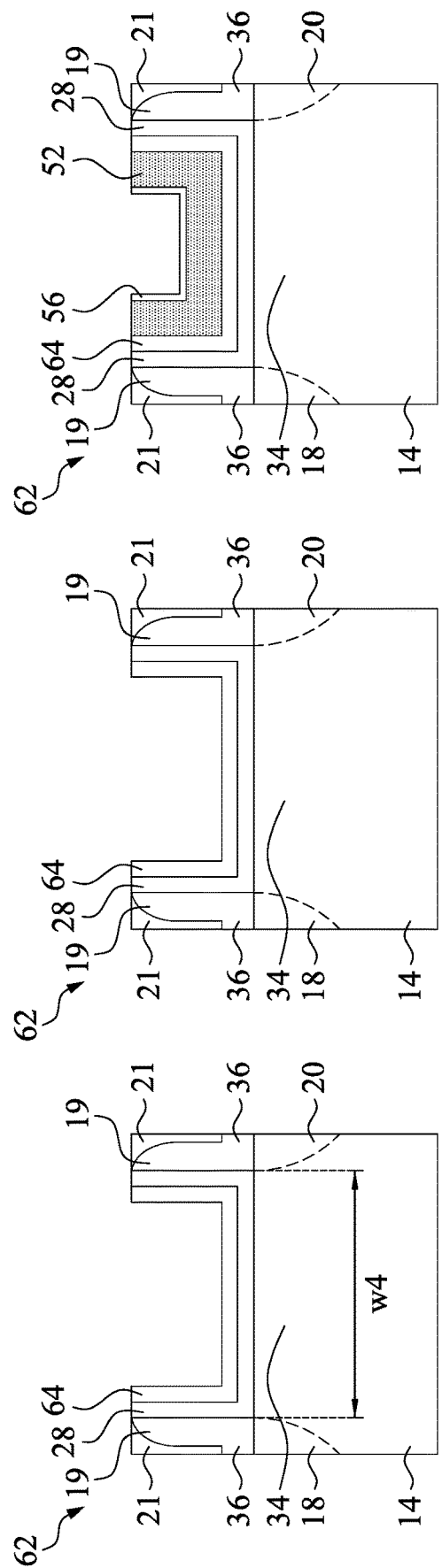

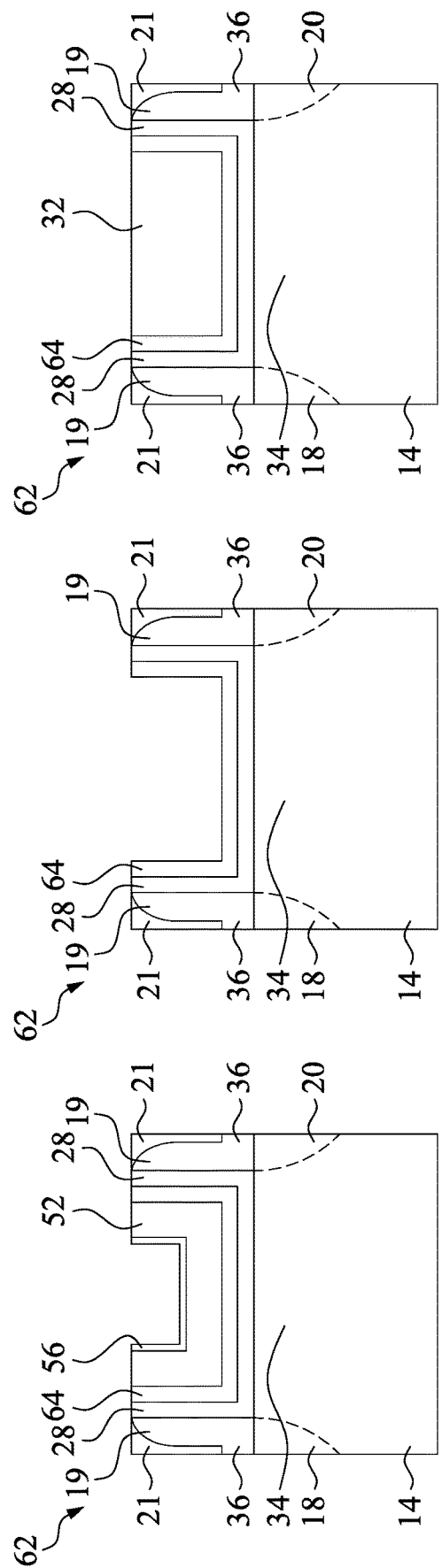

TRANSISTOR WITH A NEGATIVE CAPACITANCE AND A METHOD OF CREATING THE SAME

BACKGROUND

Field effect transistors (FET) are used in a wide variety of semiconductor devices. Generally, a FET includes a gate structure positioned over a channel region and between source and drain regions. The gate structure typically includes a gate dielectric layer on the channel region, and a gate electrode on the gate dielectric layer.

One type of FET that is gaining in popularity is a negative capacitance field effect transistor (NCFET). In contrast to traditional FETs, the gate structure of NCFETs has a negative capacitance. NCFETs have various advantages over other types of transistors. For example, NCFETs generally have lower subthreshold swings compared to other types of transistors, and are able to switch between conducting and non-conducting states faster than other types of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A to 5F are cross-sectional views illustrating a method of fabricating a gate structure of a transistor having a first channel width in accordance with some embodiments.

FIGS. 6A to 6F are cross-sectional views illustrating a method of fabricating a gate structure of a transistor having a second channel width in accordance with some embodiments.

DETAILED DESCRIPTION

Figure 1:
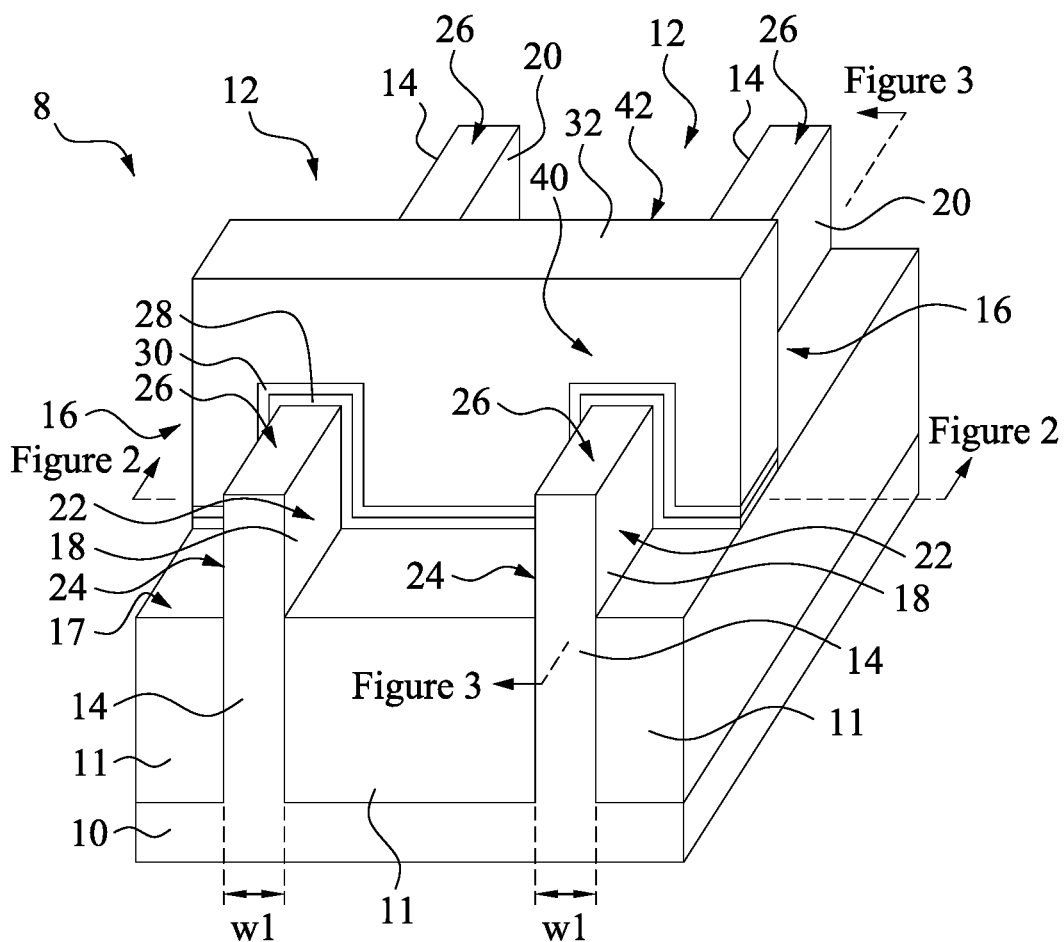
FIG. 1 is an angled view of a device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic devices are increasingly becoming smaller, while including circuits with greater complexity. Consequently, there is a demand to scale down electrical components to have smaller dimensions. Unfortunately, it is difficult to fabricate negative capacitance field effect transistors (NCFET) with scaled down dimensions. As previously discussed, an NCFET includes a gate structure with a negative capacitance. In order for the gate structure to have a negative capacitance, a ferroelectric layer is included in the gate structure. As the size of the NCFET is scaled down, current methods of fabricating NCFETs are typically unable to form the ferroelectric layer properly. For example, current methods will often not properly form the crystalline structure of the ferroelectric layer when the ferroelectric layer is thin (e.g., between 2 and 3 nanometers). As another example, current methods will often not form the ferroelectric layer at all when the ferroelectric layer is thin and the transistor has a large channel width (e.g., greater than or equal to 100 nanometers). Consequently, current methods are generally unable to fabricate NCFETs with scaled down dimensions.

The present disclosure is directed to a transistor with a negative capacitance, and a method of creating the same. In accordance with various embodiments disclosed herein, the dimensions of the transistor may be scaled up or down. As such, the transistor disclosed herein is suitable for applications in which transistors with various sizes are desirable.

Figure 2:
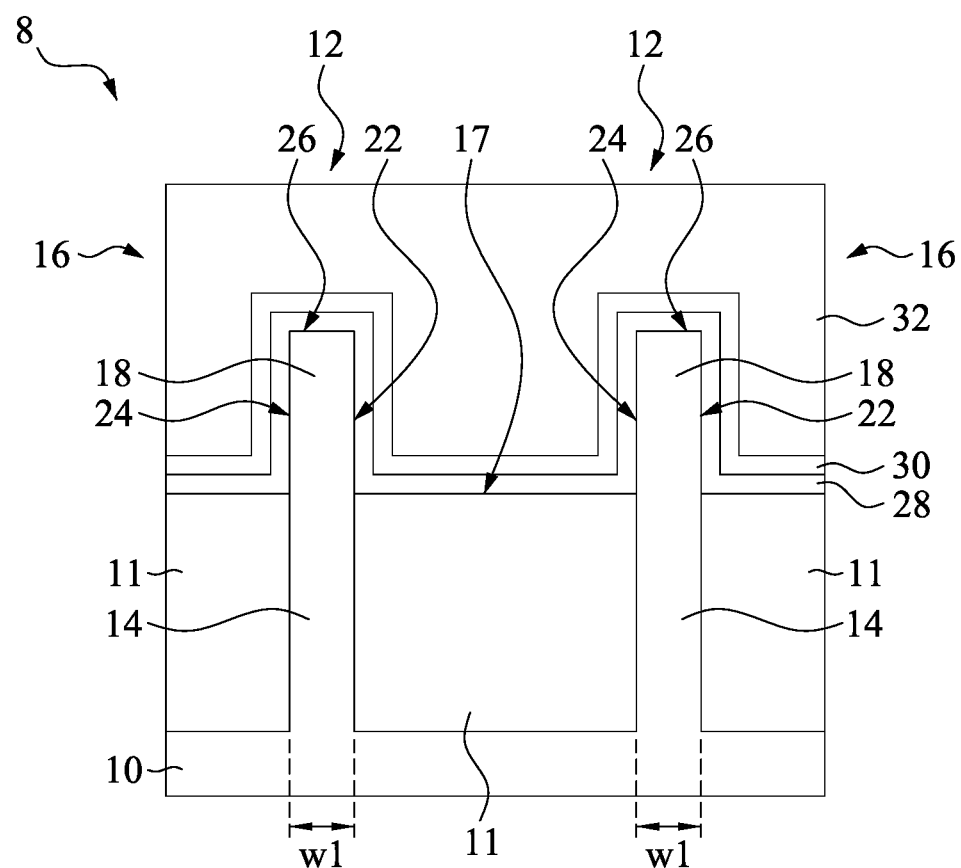
FIG. 2 is a cross-sectional view of the device along the axis shown in FIG. 1 in accordance with some embodiments.
Figure 3:
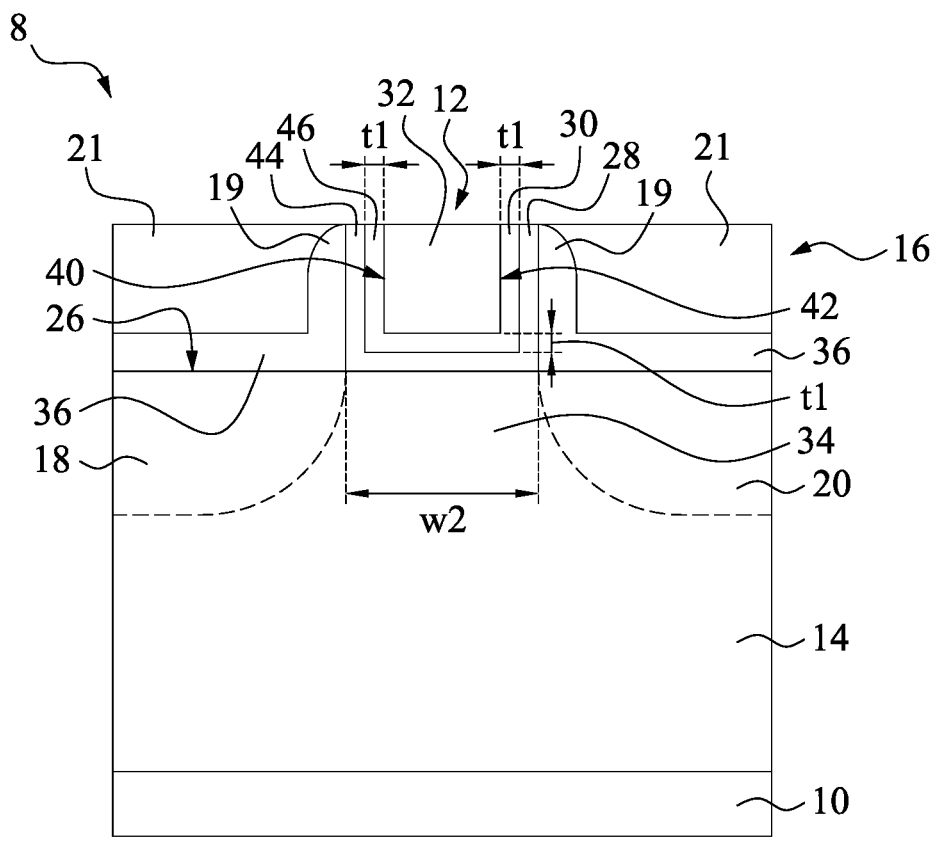
FIG. 3 is a cross-sectional view of the device along the axis shown in FIG. 1 in accordance with some embodiments.

FIG. 1 is an angled view of a device 8 in accordance with some embodiments. FIG. 2 is a cross-sectional view of the device 8 along the axis shown in FIG. 1 in accordance with some embodiments. FIG. 3 is a cross-sectional view of the device 8 along the axis shown in FIG. 1 in accordance with some embodiments. It is beneficial to review FIGS. 1 to 3 together.

The device 8 includes a substrate 10, shallow trench isolation (STI) regions 11, and transistors 12. As will be discussed in further detail below, portions of the device 8 are not shown in FIG. 1 in order to show the various layers within the device 8.

The substrate 10 provides a support for the transistors 12. The substrate 10 may include a silicon substrate and/or other elementary semiconductors like germanium. Alternatively or additionally, the substrate 10 may include a compound semiconductor, such as silicon carbide, gallium arsenide, indium arsenide, and/or indium phosphide. Further, the substrate 10 may include a silicon-on-insulator (SOI) structure. The substrate 10 may also include an epitaxial layer and/or may be strained for performance enhancement. The substrate 10 may also include various doping configurations, such as P-type substrate and/or N-type substrate, depending on the design of the transistors 12.

In one embodiment, other various electrical components are fabricated in or on the substrate 10. For example, transistors, resistors, capacitors, etc., may be fabricated in or on the substrate 10 along with the transistors 12.

The STI regions 11 are formed on the substrate 10 and between the transistors 12. The STI regions 11 isolate the transistors 12 from each other, and prevent current leakage between the transistors 12. The STI regions 11 may be made of silicon oxide or any other suitable dielectric material. In one embodiment, the STI regions 11 are made from a single dielectric layer.

The STI regions 11 may be formed using various semiconductor processing techniques. For example, the STI regions 11 may be formed using chemical vapor deposition (CVD), high density plasma CVD, spin-on, sputtering, or other suitable approaches. In one embodiment, the STI regions 11 are formed after the fins 14 are formed. For instance, in one embodiment, the fins 14 are formed from the substrate 10 using, for example, an etching or patterning process. Subsequently, the STI regions 11 are formed on the substrate 10 and adjacent to the fins 14 as shown in FIG. 1 using, for example, a combination of deposition, chemical mechanical planarization (CMP), and etch back processes.

The transistors 12 are formed on the substrate 10. In one embodiment, each of the transistors 12 is a NCFET. Each of the transistors 12 includes a fin 14, a gate structure 16, spacers 19, and contact etch stop layers (CESLs) 36. An interlayer dielectric (ILD) 21 is formed over the transistors 12. As will be discussed in further detail below, portions of the gate structure 16, the spacers 19, the CESLs 36, and the ILD 21 are not shown in FIG. 1 in order to show the various layers within the device 8.

Although two transistors 12 are shown in FIGS. 1 and 2, the device 8 may include any number of transistors. For example, the device 8 may include an array of multiple transistors arranged in a plurality of rows and columns.

The fins 14 are formed on the substrate 10 and extend between the STI regions 11. As best shown in FIGS. 1 and 2, the fins 14 extend from the substrate 10, between the STI regions 11, and past upper surfaces 17 of the STI regions 11 such that portions of the fins 14 are above the upper surfaces 17 of the STI regions 11.

In one embodiment, the fins 14 are made of semiconductor material, such as silicon, germanium, silicon carbide, indium phosphide, gallium arsenic, indium arsenide, or combinations thereof. In one embodiment, the fins 14 are made of the same material as the substrate 10.

The fins 14 may be formed using various semiconductor processing techniques. For example, the fins 14 may be formed using chemical vapor deposition (CVD), high density plasma CVD, spin-on, sputtering, or other suitable approaches. As another example, the fins 14 may be formed from the substrate 10 by etching or patterning the substrate 10.

In one embodiment, each of the fins 14 has a substantially uniform width. For example, as best shown in FIGS. 1 and 2, each of the fins 14 has a first width w1. In one embodiment the first width w1 is between 5 and 15 nanometers. It is noted that the first width w1 is not limited to the foregoing and in other embodiments may be smaller or greater than the example given. For example, the device 8 may be scaled down such that the first width w1 is between 2 and 3 nanometers, or scaled up such that the first width w1 is between 25 and 50 nanometers. In another embodiment, each of the fins 14 has a varying width. For example, in one embodiment, each of the fins 14 has a width that changes from a width that is smaller than the first width w1 to a width that is larger than the first width w1.

In one embodiment, each of the fins 14 has the same width. For example, as shown in FIGS. 1 and 2, each of the fins 14 has the first width w1. In another embodiment, the fins 14 have different widths from each other.

In one embodiment, as best shown in FIGS. 1 and 2, the cross-sections of the fins 14 each have a rectangular shape. However, other shapes are possible. For example, the cross-sections of the fins 14 may have a diamond shape, circular shape, etc.

Each of the fins 14 includes a source region 18 and a drain region 20. In one embodiment, as best shown in FIG. 3, the source region 18 and the drain region 20 are positioned on opposite sides of the gate structure 16.

The source region 18 and the drain region 20 are doped regions, and may have any type of doping profile depending on the design of the transistors 12. For example, the source region 18 and the drain region 20 may be n-type or p-type doped regions with any level of doping concentration. It is noted that the positions of the source region 18 and the drain region 20 may be interchanged with each other.

The source region 18 and the drain region 20 may be formed using various semiconductor processing techniques. For example, the fins 14 may be implanted with one or more dopant species, such as phosphorous, boron, etc., to form the source region 18 and the drain region 20; or the source region 18 and the drain region 20 may be epitaxially grown.

The gate structure 16 is formed on the STI regions 11 and over the fins 14. The gate structure 16 surrounds one or more sides of the fins 14. In one embodiment, as best shown in FIGS. 1 and 2, the gate structure 16 is positioned on three different sides of the fins 14. Namely, the gate structure 16 is formed on a first side surface 22, a second side surface 24 opposite to the first side surface 22, and an upper surface 26 of the fins 14. The gate structure 16 includes a gate dielectric layer 28, a ferroelectric layer 30, and a gate electrode 32. As will be discussed in further detail below, portions of the gate structure 16, the spacers 19, CESLs 36, and the ILD 21 are not shown in FIG. 1 in order to show the various layers within the device 8.

The gate dielectric layer 28 is formed on the STI regions 11 and the fins 14. The gate dielectric layer 28 electrically isolates the gate electrode 32 from the fins 14. In one embodiment, the gate dielectric layer 28 has an amorphous structure. However, the gate dielectric layer 28 may also have a crystalline structure.

In one embodiment, as best shown in FIGS. 1 and 2, the gate dielectric layer 28 is formed on a first side surface 22, a second side surface 24 opposite to the first side surface 22, and an upper surface 26 of the fins 14.

The gate dielectric layer 28 may be made of a variety of different dielectric materials. For example, the gate dielectric layer 28 may include nitride; silicon oxide; a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), and/or hafnium zirconium oxide (HfZrO); combinations thereof; and/or other suitable materials.

In one embodiment, the gate dielectric layer 28 is a single dielectric layer. In another embodiment, the gate dielectric layer 28 includes multiple dielectric layers. For example, the gate dielectric layer 28 may include a first dielectric layer made of a first material, a second dielectric layer made of a second material, and a third dielectric layer made of a third material. The materials for the first, second, and third dielectric layers may be selected from any of the dielectric materials described in the previous paragraph.

The gate dielectric layer 28 may be formed using various semiconductor processing techniques. For example, the gate dielectric layer 28 may be formed using CVD, high density plasma CVD, spin-on, sputtering, or other suitable approaches.

The ferroelectric layer 30 is formed on the gate dielectric layer 28. The ferroelectric layer 30 is a layer of material with ferroelectric properties, such as having a reversible electrical polarization. For example, the ferroelectric layer 30 may be made of $HfSiO_x$, $Al_2O_3$, $HfZrO_x$, doped HfZrO, $LaO_x$, $TiO_2$, $HfO_2$, $BaSrTiO_x$, $PbZr_xTi_yO_z$, combinations thereof with various ratios, or any other suitable material. In one embodiment, the ferroelectric layer 30 has a crystalline structure. For example, the ferroelectric layer 30 may have an orthorhombic crystalline structure.

In one embodiment, as best shown in FIGS. 1 and 2, the ferroelectric layer 30 is formed on a first side surface 22, a second side surface 24 opposite to the first side surface 22, and an upper surface 26 of the fins 14.

The ferroelectric layer 30 has a thickness t1. In one embodiment, the ferroelectric layer 30 is a thin film. For example, in one embodiment, the thickness t1 is less than or equal to 5 nanometers. In one embodiment, the thickness t1 is between 2 and 3 nanometers. It is noted that the thickness t1 is not limited to the foregoing and in other embodiments may be smaller or greater than the example given. For example, the thickness t1 may be greater than 5 nanometers.

The fabrication of the ferroelectric layer 30 will be discussed in further detail below with respect to FIGS. 4A, 4B, and 4C.

The gate electrode 32 is formed on the ferroelectric layer 30. As best shown in FIG. 3, the gate electrode 32 directly overlies a channel region 34 that extends between the source region 18 and the drain region 20.

The channel region 34 has a channel width w2. In one embodiment, the channel region 34 has a narrow width (i.e., the channel region 34 is a short-channel). For example, in one embodiment, the channel width w2 is less than or equal to 50 nanometers. As will be discussed in further detail below, the narrow width of the channel region 34 helps the ferroelectric layer 30 have a desired thickness and phase during fabrication. It is noted that the channel width w2 is not limited to the foregoing and in other embodiments may be smaller or greater than the example given.

The channel region 34 may be made of a variety of materials. For example, the channel region 34 may be a Si, SiGe, or a Ge channel. Further, the channel region 34 may be strained for performance enhancement or relaxed. In one embodiment, the channel region 34 is a high mobility channel.

In one embodiment, as best shown in FIGS. 1 and 2, the gate structure 16 is shared between the transistors 12. In this embodiment, the gate structure 16 overlies both of the fins 14. In another embodiment, each of the transistors 12 includes its own gate structure. In this embodiment, a separate gate structure is formed over each of the transistors 12.

The gate electrode 32 is made of a conductive material. For example, the gate electrode 32 may be made of a doped polysilicon; metal such as Hf, Zr, Ti, Ta, TiN, TaN, TaC, Co, Ru, Al, Cu, and/or W; combinations thereof; or multi-layers thereof.

The gate electrode 32 may be formed using various semiconductor processing techniques. For example, the gate electrode 32 may be formed using CVD, high density plasma CVD, spin-on, sputtering, or other suitable approaches.

The gate structure 16 (specifically, the gate dielectric layer 28, the ferroelectric layer 30, and the gate electrode 32), the source region 18, the drain region 20, and the channel region 34 are configured to provide a negative capacitance. The negative capacitance provides various advantages over other types of transistors. For example, the negative capacitance of the gate structure 16 allows the transistor 12 to have a lower subthreshold swing compared to other types of transistors. As a result, the transistor 12 is able to switch between conducting and non-conducting states faster than other types of transistors.

The spacers 19 are formed on the upper surface 26 of the fins 14, and are positioned on opposite sides of the gate electrode 32. As best shown in FIG. 3, a first spacer is positioned lateral to a first surface 40 of the gate electrode 32; and a second spacer is positioned lateral to a second surface 42, opposite to the first surface 40, of the gate electrode 32. The spacers 19 protect sidewalls of the gate electrode 32. As will be discussed in further detail below, the spacers 19 are used during fabrication of the gate dielectric layer 28, the ferroelectric layer 30, and the gate electrode 32 of the gate structure 16.

In one embodiment, the spacers 19 are made of a dielectric material. For example, the spacers 19 may be made of nitride; a low K dielectric material such as silicon oxynitride ($SiO_xN_y$), silicon nitride ($Si_3N_4$), silicon monoxide (SiO); silicon oxynitrocarbide (SiONC), and silicon oxycarbide (SiOC); combinations thereof, and/or other suitable materials.

The CESLs 36 are formed on the upper surface 26 of the fins 14, and are positioned on opposite sides of the gate electrode 32. As best shown in FIG. 3, a first CESL is positioned lateral to a first surface 40 of the gate electrode 32; and a second CESL is positioned lateral to a second surface 42, opposite to the first surface 40, of the gate electrode 32. The CESLs 36 protect the fin 14. As will be discussed in further detail below, the CESL 36 are used during fabrication of the gate dielectric layer 28, the ferroelectric layer 30, and the gate electrode 32 of the gate structure 16.

In one embodiment, the CESLs 36 are made of a dielectric material. For example, the CESLs 36 may be made of nitride; a low K dielectric material such as silicon oxynitride ($SiO_xN_y$), silicon nitride ($Si_3N_4$), silicon monoxide (SiO); silicon oxynitrocarbide (SiONC), and silicon oxycarbide (SiOC); combinations thereof, and/or other suitable materials.

In one embodiment, as best shown in FIG. 3, the CESLs 36 extend in a first direction along the upper surface 26 of the fins 14, and the spacers 19 extend in a second direction, transverse to the first direction, along the sidewalls of the gate electrode 32.

The ILD 21 is formed on the spacers 19 and the CESLs 36. In one embodiment, the ILD 21 is also formed over the transistors 12. Namely, the ILD 21 may be formed directly above the gate structure 16.

In one embodiment, the ILD 21 is used to form an interconnect layer. For example, the ILD 21 may be used to electrically isolate conductive vias that electrically couple the source region 18, the drain region 20, and/or the gate electrode 32 to other various electrical components (e.g., contact pads, transistors, capacitors, resistors, processors, etc.) and/or other interconnection layers. The ILD 21, with the conductive vias, is sometimes referred to as a metal layer.

The ILD 21 may be made of a variety of different dielectric materials. For example, the ILD 21 may be made of nitride; a low K dielectric material such as silicon oxynitride ($SiO_xN_y$), silicon nitride ($Si_3N_4$), silicon monoxide (SiO), silicon oxynitrocarbide (SiONC), and silicon oxycarbide (SiOC); combinations thereof; and/or other suitable materials.

The ILD 21 may be formed using various semiconductor processing techniques. For example, the ILD 21 may be formed using CVD, high density plasma CVD, spin-on, sputtering, or other suitable approaches.

It is noted that portions of the gate dielectric layer 28, portions of the ferroelectric layer 30, the spacers 19, the CESLs 36, and the ILD 21 are not shown in FIG. 1 in order to show the various layers within the device 8. In particular, comparing FIGS. 1 and 3, it can be gleaned that a side portion 44 of the gate dielectric layer 28, a side portion 46 of the ferroelectric layer 30, the spacers 19, CESLs 36 and the ILD 21 are not shown in FIG. 1. As a result, the first surface 40 of the gate electrode 32 is exposed in FIG. 1.

As previously discussed, it is generally difficult to fabricate NCFETs with scaled down dimensions. As the size of the NCFET is scaled down, current methods of fabricating NCFETs are typically unable to form the ferroelectric layer properly. For example, current methods will often not properly form the crystalline structure of the ferroelectric layer when the ferroelectric layer is thin (e.g., between 2 and 3 nanometers). FIGS. 4A to 4C are cross-sectional views illustrating a method of fabricating the device 8 in accordance with some embodiments. It is noted that FIGS. 4A to 4C show the same cross-sectional view as shown in FIG. 3. It is also noted that the steps shown in FIGS. 4A to 4C may be performed for each of the transistors 12.

Figure 4A:
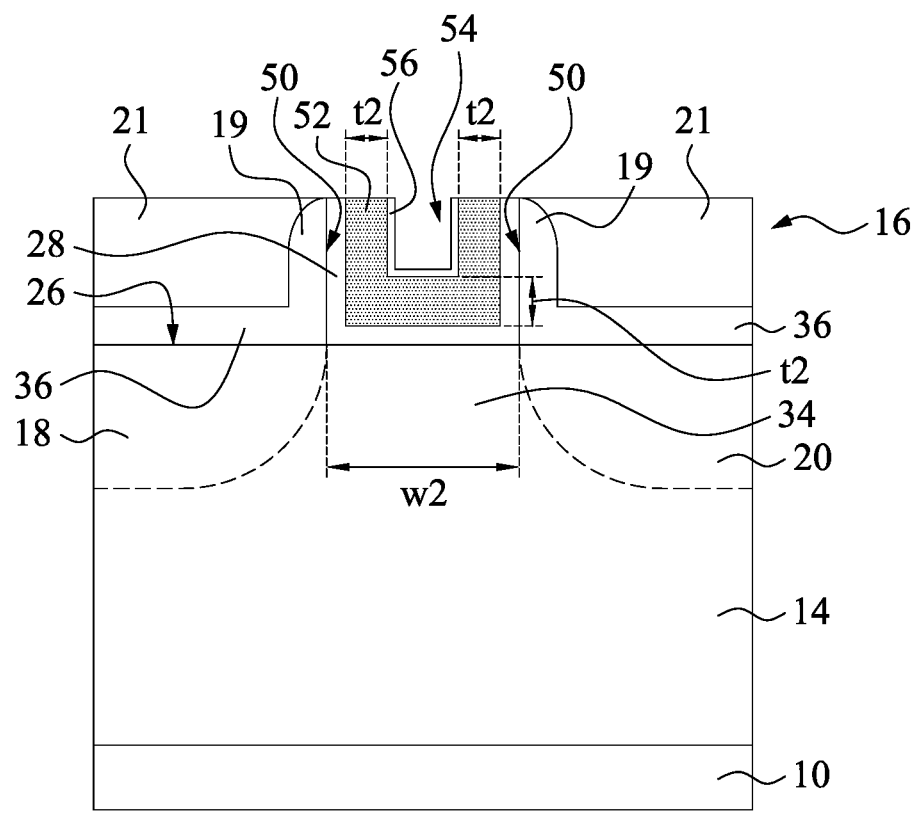
FIGS. 4A to 4C are cross-sectional views illustrating a method of fabricating the device of FIG. 1 in accordance with some embodiments.
Figure 4B:
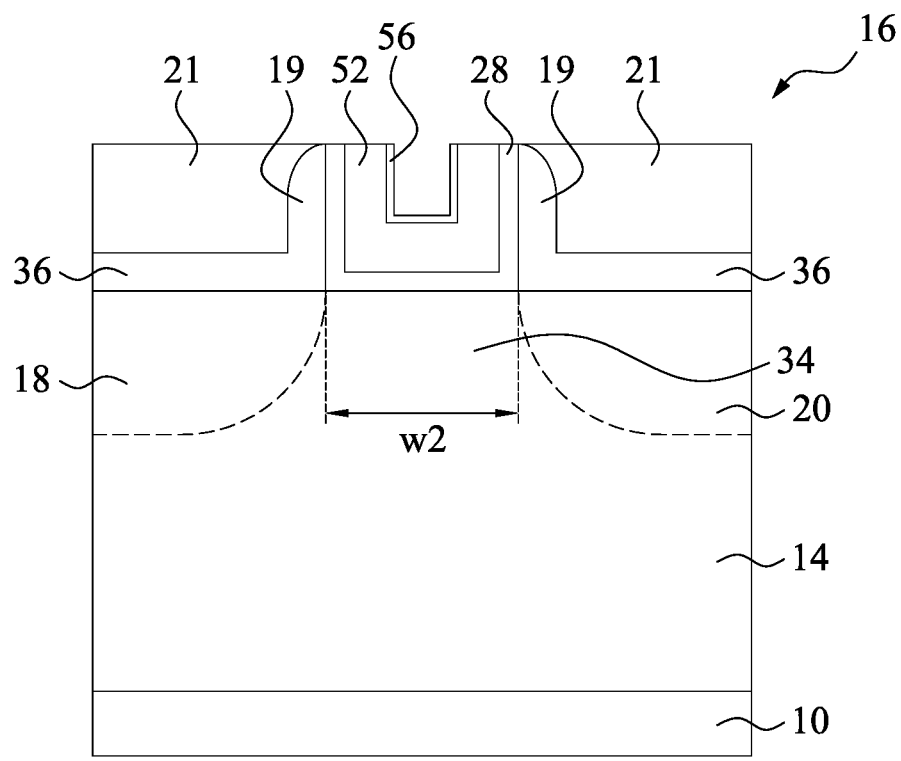
Figure 4C:
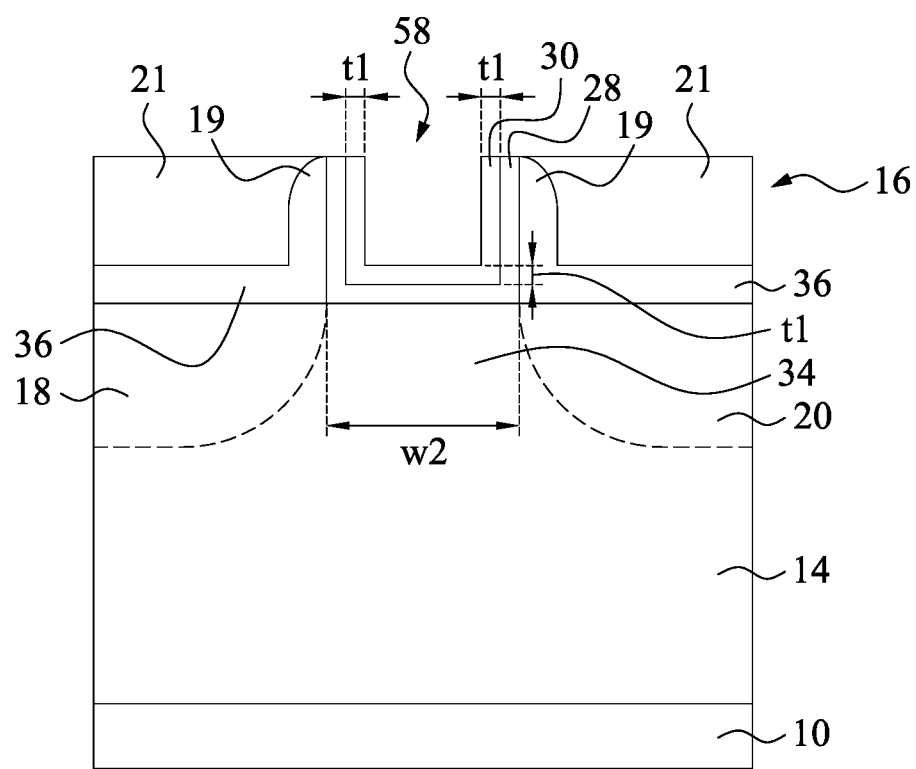

The method as described with respect to FIGS. 4A to 4C is able to fabricate a ferroelectric layer (e.g., the ferroelectric layer 30) regardless of its thickness. For example, the method as described with respect to FIGS. 4A to 4C is able to fabricate a thin ferroelectric layer having a thickness between 2 and 3 nanometers. It is noted that the thickness of the ferroelectric layer 30 is not limited to the foregoing and in other embodiments may be smaller or greater than the example given.

In FIG. 4A, the fins 14, the source region 18, the drain region 20, the channel region 34, the spacers 19, the CESLs 36, the ILD 21, and the gate dielectric layer 28 are formed on the substrate 10 as discussed with respect to FIGS. 1 to 3. The gate dielectric layer 28 is formed on inner surfaces 50 of the spacers 19, and the upper surface 26 of the fins 14.

Subsequent to the fins 14, the source region 18, the drain region 20, the channel region 34, the spacers 19, the CESLs 36, the ILD 21, and the gate dielectric layer 28 being formed, a ferroelectric film 52 is formed on the gate dielectric layer 28. The ferroelectric film 52 forms a trench 54. As will be discussed with respect to FIG. 4C, the ferroelectric film 52 is used to form the ferroelectric layer 30. In one embodiment, the ferroelectric film 52 is in an amorphous state when it is formed on the gate dielectric layer 28 in FIG. 4A.

The ferroelectric film 52 has a thickness t2. In one embodiment, the thickness t2 is larger than the thickness t1 of the ferroelectric layer 30. For example, in one embodiment, when the thickness t1 of the ferroelectric layer 30 is less than or equal to 5 nanometers, the thickness t2 is greater than 5 nanometers. In one embodiment, the thickness t2 is greater than 5 nanometers and less than 15 nanometers. It is noted that the thickness t2 is not limited to the foregoing and in other embodiments may be smaller or greater than the example given. Having a large thickness for the ferroelectric film 52 ensures that the ferroelectric film 52 properly covers the gate dielectric layer 28. In addition, as will be discussed with respect to FIG. 4B, having a large thickness for the ferroelectric film 52 ensures that the ferroelectric film 52 has the proper phase after annealing.

The ferroelectric film 52 may be made of any suitable material to form a layer with ferroelectric properties. For example, the ferroelectric film 52 may be made of $HfSiO_x$, $Al_2O_3$, $HfZrO_x$, doped $HfZrO_x$. $LaO_x$, $TiO_2$, $HfO_2$, $BaSrTiO_x$, $PbZr_xTi_yO_z$, combinations thereof, or any other suitable material.

The ferroelectric film 52 may be formed using various semiconductor processing techniques. For example, the ferroelectric film 52 may be formed using CVD, high density plasma CVD, spin-on, sputtering, atomic layer deposition (ALD), or other suitable approaches.

Once the ferroelectric film 52 is formed, a protective layer 56 is formed on the ferroelectric film 52 and in the trench 54. The protective layer 56 prevents damage to the ferroelectric film 52 during the annealing process that will be discussed with respect to FIG. 4B.

In one embodiment, the protective layer 56 is made of a conductive material, such as Hf, Zr, Ti, Ta, TiN, TaN, TaC, Co, Ru, Ai Cu; and/or W; combinations thereof; or multi-layers thereof.

Whether or not a layer of material has ferroelectric properties depends on a variety of factors, such as the elements included in the layer of material, the proportions of the elements included in the layer of material, and the phase of the layer of material. As previously discussed, the ferroelectric film 52 may be made of any suitable material to form a layer with ferroelectric properties (e.g., $HfSiO_x$, $Al_2O_3$, $Hf_xZrO_x$, $LaO_x$, $TiO_2$, $HfO_2$, $BaSrTiO_x$, $PbZr_xTi_yO_z$; combinations thereof; or any other suitable material). In addition, each of the materials used for the ferroelectric film 52 may have varying ratios of elements. For example, the ferroelectric film 52 may be made of $HfZrO_2$ or $Hf_xZr_{1-x}O_2$, where x may be equal to 0 to 0.5. In FIG. 4B, an annealing process is performed to change the phase of the ferroelectric film 52 such that the ferroelectric film 52 has ferroelectric properties. In particular, as previously discussed, the ferroelectric film 52 is in an amorphous state when it is formed on the gate dielectric layer 28 in FIG. 4A. In FIG. 4B, the ferroelectric film 52 is annealed to change the phase of the ferroelectric film 52 from an amorphous state to a crystalline state. For example, the ferroelectric film 52 may be annealed in a gas atmosphere (e.g., an oxygen atmosphere) between 650 to 900 degrees Celsius. In one embodiment, the ferroelectric film 52 is annealed using a spike anneal process in which the ferroelectric film 52 is heated between 750 and 900 degrees Celsius for 25 to 35 seconds. Once the annealing process is performed in FIG. 4B, the ferroelectric film 52 is in a crystalline state and has ferroelectric properties.

It is noted that the phase of the ferroelectric film 52 is easily changed to from an amorphous state to a crystalline state by the annealing process because of the large thickness t2 of the ferroelectric film 52. If the ferroelectric film 52 were a thin film (e.g., having a thickness between 2 and 3 nanometers), the phase of the ferroelectric film 52 may not change from an amorphous state to a crystalline state by the annealing process. Consequently, the ferroelectric film 52 would not have ferroelectric properties.

In FIG. 4C, the protective layer 56 and portions of the ferroelectric film 52 are removed. Portions of the ferroelectric film 52 are removed to thin the ferroelectric film 52 to a desired thickness and form the ferroelectric layer 30. For example, the thickness t2 of the ferroelectric film 52 is reduced to the thickness t1, as shown in FIG. 3, of the ferroelectric layer 30. The ferroelectric layer 30 forms a trench 58.

The protective layer 56 and portions of the ferroelectric film 52 may be removed using various semiconductor processing techniques. For example, the protective layer 56 and portions of the ferroelectric film 52 may be removed using masking and etching techniques. In one embodiment, upper surfaces of the ILD 21, the gate dielectric layer 28, and portions of the ferroelectric film 52 that are used to form the ferroelectric layer 30 are masked. Remaining portions of the ferroelectric film 52 and the protective layer 56 are left exposed. Subsequently, an etching process is performed to remove the exposed portions of the ferroelectric film 52 and the entire protective layer 56. In one embodiment, the exposed portions of the ferroelectric film 52 and the entire protective layer 56 are removed using a single etching process. In another embodiment, the entire protective layer 56 is removed first using a first etching process, and then the exposed portions of the ferroelectric film 52 is removed using a second etching process. The ferroelectric film 52 is etched until a desired thickness is reached (e.g., until the ferroelectric film 52 has a thickness less than or equal to 5 nanometers) to form the ferroelectric layer 30.

As previously discussed, in one embodiment, the channel region 34 has a narrow width (e.g., the channel region 34 is a short-channel). For example, in one embodiment, the channel width w2 is less than or equal to 50 nanometers. The narrow width of the channel region 34 ensures that the ferroelectric film 52 is not excessively thinned or completely removed during the thinning process in FIG. 4C. If the channel region 34 is too wide (e.g., the channel region 34 is a long-channel with a width, for example, greater than or equal to 100 nanometers), the ferroelectric film 52 will often be excessively thinned or completely removed during, for example, an etch-back process due to a loading effect. That is, the etch-back process may drastically accelerate due to the large size of the channel region 34 and thin the ferroelectric film 52 beyond a desired thickness. It is noted that the given examples for the width of the channel region 34 are not limited to the foregoing and in other embodiments may be smaller or greater than the examples given.

Once the ferroelectric film 52 is thinned to a desired thickness to form the ferroelectric layer 30, the gate electrode 32 is formed in the trench 58. As a result, the gate structure 16 as shown in FIG. 3 is obtained.

As discussed above with respect to FIGS. 1 to 3, the gate electrode 32 may be formed using various semiconductor processing techniques. For example, the gate electrode 32 may be formed using CVD, high density plasma CVD, spin-on, sputtering, or other suitable approaches.

As previously discussed, if the channel region 34 has a large width, the ferroelectric film 52 will often be excessively thinned or completely removed during, for example, an etch-back process. Fortunately, when the channel region 34 has a large width, the ferroelectric layer 30 is not necessary in order for the transistor 12 to have a negative capacitance. Rather, the ferroelectric layer 30 may be replaced with a high-K dielectric layer. Thus, a different process than what was described with respect to FIGS. 4A to 4C may be used to fabricate a gate structure of a transistor with a channel region 34 having a large width. FIGS. 5A to 5F and FIGS. 6A to 6F illustrate methods of fabricating a gate structure of a transistor having a narrow channel width, along with a gate structure of a transistor having a large channel width in accordance with some embodiments. The gate structure of a transistor having a large channel width includes a high-K dielectric layer instead of a ferroelectric layer.

FIGS. 5A to 5F are enlarged cross-sectional views illustrating a method of fabricating a gate structure 60 of a transistor having a first channel width w3 in accordance with some embodiments. FIGS. 6A to 6F are enlarged cross-sectional views illustrating a method of fabricating a gate structure 62 of a transistor having a second channel width w4 in accordance with some embodiments. It is noted that FIGS. 5A to 5F and FIGS. 6A to 6F show the same cross-sectional view as shown in FIG. 3. It is also noted that the cross-sectional views shown in FIGS. 5A to 5F and FIGS. 6A to 6F are enlarged and the substrate 10 is not shown.

In one embodiment, the first channel width w3 is smaller than the second channel width w4. For example, in one embodiment, the first channel width w3 is less than or equal to 50 nanometers, and the second channel width w4 is greater than or equal to 100 nanometers. It is noted that the first channel width w3 and the second channel width w4 are not limited to the foregoing and in other embodiments may be smaller or greater dimensions than the examples given.

In one embodiment, the steps shown in FIGS. 5A to 5F and FIGS. 6A to 6F are used to fabricate two different transistors on the same substrate. For example, in one embodiment, the steps shown in FIGS. 5A to 5F are used to fabricate a first transistor on the substrate 10, and the steps shown in FIGS. 6A to 6F are used to fabricate a second transistor on the substrate 10. In this embodiment, the steps shown in FIGS. 5A to 5F are performed concurrently with the steps shown in FIGS. 6A to 6F, respectively. Further, as will be discussed in further detail below, some of the fabrication steps that are performed in FIGS. 5A to 5F are the same fabrication steps performed in FIGS. 6A to 6F. Thus, it is beneficial to review FIGS. 5A to 5F and FIGS. 6A to 6F together. It is noted that the steps shown in FIGS. 5A to 5F and FIGS. 6A to 6F may also be used to fabricate two different transistors on two different substrates, and the steps shown in FIGS. 5A to 5F may be performed separately from the steps shown in FIGS. 6A to 6F.

Figures 5D, 5E, 5F:
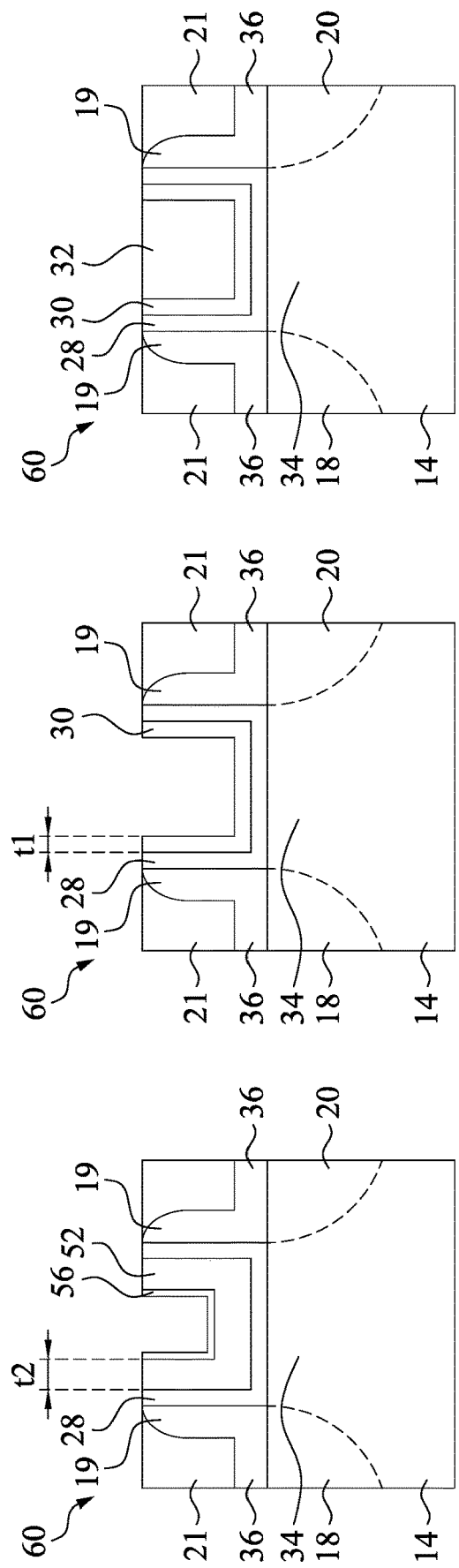

In FIGS. 5A and 6A, similar to FIG. 4A, the fins 14, the source region 18, the drain region 20, the channel region 34, the spacers 19, the CESLs 36, the ILD 21, and the gate dielectric layer 28 are formed on the substrate 10. As noted above, the substrate 10 is not shown in FIGS. 5A to 5F and FIGS. 6A to 6F. The fabrication of the fins 14, the source region 18, the drain region 20, the channel region 34, the spacers 19, the CESLs 36, the ILD 21, and the gate dielectric layer 28 have been previously discussed with respect to FIG. 4A and will not be discussed again here.

Subsequent to the fins 14 the source region 18, the drain region 20, the channel region 34, the spacers 19, the CESLs 36, the ILD 21, and the gate dielectric layer 28 being formed, a high-K dielectric layer 64 is formed on the gate dielectric layer 28.

The high-K dielectric layer 64 may be made of a variety of different dielectric materials having a high dielectric constant, such as hafnium oxide ($HfO_2$), zirconium oxide ($ZrO_2$), hafnium silicon oxide (HfSiO), hafnium silicon oxynitride (HfSiON), hafnium tantalum oxide (HMO), hafnium titanium oxide (HMO), and/or hafnium zirconium oxide (HfZrO); combinations thereof; and/or other suitable materials.

The high-K dielectric layer 64 may be formed using various semiconductor processing techniques. For example, the high-K dielectric layer 64 may be formed using CVD, high density plasma CVD, spin-on, sputtering, ALD, or other suitable approaches.

In FIG. 5B, the high-K dielectric layer 64 is removed to expose the gate dielectric layer 28. In one embodiment, the high-K dielectric layer 64 is completely removed.

The high-K dielectric layer 64 may be removed using various semiconductor processing techniques. For example, the high-K dielectric layer 64 may be removed using photolithography, masking and etching techniques, etc.

In FIG. 6B, the high-K dielectric layer 64 is not removed. The gate structure 62 remains the same in FIG. 6B.

In FIG. 5C, subsequent to the high-K dielectric layer 64 being removed in FIG. 5B, the ferroelectric film 52 is formed on the gate dielectric layer 28. In addition, the protective layer 56 is formed on the ferroelectric film 52. The fabrication of the ferroelectric film 52 and the protective layer 56 has been previously discussed with respect to FIG. 4A and will not be discussed again here. In one embodiment, the ferroelectric film 52 is in an amorphous state when it is formed on the gate dielectric layer 28 in FIG. 5C.

In FIG. 6C, as the high-K dielectric layer 64 was not removed in FIG. 6B, the ferroelectric film 52 is formed on the high-K dielectric layer 64. The protective layer 56 is then formed on the ferroelectric film 52. The fabrication of the ferroelectric film 52 and the protective layer 56 has been previously discussed with respect to FIG. 4A and will not be discussed again here. In one embodiment, the ferroelectric film 52 is in an amorphous state when it is formed on the high-K dielectric layer 64 in FIG. 6C.

As previously discussed, in one embodiment, the steps shown in FIGS. 5A to 5F are performed concurrently with the steps shown in FIGS. 6A to 6F, respectively. In this embodiment, the forming of the ferroelectric film 52 in FIG. 5C and the forming of the ferroelectric film 52 in FIG. 6C may be performed in a single step. For example, a single deposition process may be used to form the ferroelectric film 52 in FIG. 5C and form the ferroelectric film 52 in FIG. 6C. The forming of the protective layer 56 in FIG. 5C and the forming of the protective layer 56 in FIG. 6C may also be similarly performed in a single step.

In FIGS. 5D and 6D, an annealing process is performed to change the phase of the ferroelectric films 52 from an amorphous state to a crystalline state such that the ferroelectric films 52 have ferroelectric properties. Once the annealing process is performed in FIGS. 5D and 6D, the ferroelectric films 52 have ferroelectric properties. The annealing process has been previously discussed with respect to FIG. 4B and will not be discussed again here.

As previously discussed, in one embodiment, the steps shown in FIGS. 5A to 5F are performed concurrently with the steps shown in FIGS. 6A to 6F, respectively. In this embodiment, the annealing process in FIG. 5D and the annealing process in FIG. 6D may be a single annealing process. For example, the ferroelectric film 52 of the gate structure 60 in FIG. 5D and the ferroelectric film 52 of the gate structure 62 in FIG. 6D may be heated at the same time.

In FIG. 5E, the protective layer 56 and portions of the ferroelectric film 52 are removed. Portions of the ferroelectric film 52 are removed to thin the ferroelectric film 52 to a desired thickness and form the ferroelectric layer 30. For example, the thickness t2 of the ferroelectric film 52 is reduced to the thickness t1 of the ferroelectric layer 30. The removing of the protective layer 56 and the thinning of the ferroelectric film 52 has been previously discussed with respect to FIG. 4C and will not be discussed again here.

In FIG. 6E, the protective layer 56 and the ferroelectric film 52 are removed to expose the high-K dielectric layer 64. In one embodiment, the protective layer 56 and the ferroelectric film 52 are completely removed. The protective layer 56 and the ferroelectric film 52 may be removed using various semiconductor processing techniques. For example, the protective layer 56 and the ferroelectric film 52 may be removed using photolithography, masking and etching techniques, etc. In one embodiment, upper surfaces of the ILD 21, the gate dielectric layer 28, and the high-K dielectric layer 64 are masked; and the ferroelectric film 52 and the protective layer 56 are left exposed. Subsequently, an etching process is performed to remove the protective layer 56 and the ferroelectric film 52 and expose the high-K dielectric layer 64. In one embodiment, the protective layer 56 and the ferroelectric film 52 are removed using a single etching process. In another embodiment, the protective layer 56 is removed first using a first etching process, and then the ferroelectric film 52 is removed using a second etching process.

As previously discussed, in one embodiment, the steps shown in FIGS. 5A to 5F are performed concurrently with the steps shown in FIGS. 6A to 6F, respectively. In this embodiment, the removing of the protective layer 56 and portions of the ferroelectric film 52 in FIG. 5E and the removing of the protective layer 56 and the ferroelectric film 52 in FIG. 6E may be performed in a single step. For example, a single etching process may be used to remove the protective layer 56 and portions of the ferroelectric film 52 in FIG. 5E and remove the protective layer 56 and the ferroelectric film 52 in FIG. 6E.

In FIG. 5F, once the ferroelectric film 52 is thinned to a desired thickness to form the ferroelectric layer 30, the gate electrode 32 is formed on the ferroelectric layer 30. As a result, the gate structure 60 as shown in FIG. 5F is substantially similar to the gate structure 16 as shown in FIG. 3. The fabrication of the gate electrode 32 has been discussed above and will not be discussed again here.

In FIG. 6F, once the protective layer 56 and the ferroelectric film 52 are removed, the gate electrode 32 is formed on the high-K dielectric layer 64. The gate structure 62 is similar to the gate structure 60 except that the ferroelectric layer 30 in the gate structure 60 is replaced with the high-K dielectric layer 64.

As previously discussed, in one embodiment, the steps shown in FIGS. 5A to 5F are performed concurrently with the steps shown in FIGS. 6A to 6F, respectively. In this embodiment, the forming of the gate electrode 32 in FIG. 5F and the forming of the gate electrode 32 in FIG. 6F may be performed in a single step. For example, a single deposition process may be used to form the gate electrode 32 in FIG. 5F and form the gate electrode 32 in FIG. 6F.

The various described embodiments provide transistors with negative capacitances, and methods of creating the same. In one or more embodiments, a transistor includes a ferroelectric layer that is formed by forming a thick ferroelectric film, annealing the ferroelectric film to have a desired phase, and thinning the ferroelectric film to a desired thickness of the ferroelectric layer. This process ensures that the ferroelectric layer will have ferroelectric properties regardless of its thickness. In one or more embodiments, the ferroelectric layer is replaced with a high-k dielectric layer. The high-K dielectric layer ensures that the transistor has a negative capacitance even when the transistor has a large channel width. Thus, the dimensions of the transistors may be scaled up or down as desired, while still having negative capacitances. Accordingly, the transistors and methods disclosed herein are suitable for applications in which transistors with various sizes are desirable.

According to one embodiment disclosed herein, a transistor includes a substrate; a dielectric layer on the substrate;

a fin extending from the substrate, through the dielectric layer, and past a surface of the dielectric layer; first and second spacers on the fin; a gate dielectric layer on the surface of the dielectric layer and on at least three sides of the fin; a ferroelectric layer on the gate dielectric layer and on at least three sides of the fin; and a gate electrode on the ferroelectric layer. The ferroelectric layer is spaced from the fin and the first and second spacers by the gate dielectric layer.

According to one embodiment disclosed herein, a method includes forming a dielectric layer on a substrate; forming a fin that extends from the substrate, through the dielectric layer, and past a surface of the dielectric layer; forming first and second spacers on the fin; forming a gate dielectric layer on the surface of the dielectric layer and on at least three sides of the fin; forming a ferroelectric layer on the gate dielectric layer and on at least three sides of the fin; and forming a gate electrode on the ferroelectric layer. The ferroelectric layer is spaced from the fin and the first and second spacers by the gate dielectric layer.

According to one embodiment disclosed herein, a method includes forming a dielectric layer on a substrate; forming a first fin that extends from the substrate, through the dielectric layer, and past a surface of the dielectric layer; forming a second fin that extends from the substrate, through the dielectric layer, and past the surface of the dielectric layer; forming first and second spacers on the first fin; forming third and fourth spacers on the second fin; forming a gate dielectric layer on the surface of the dielectric layer, on at least three sides of the first fin, and on at least three sides of the second fin; forming a ferroelectric layer on the gate dielectric layer and on at least three sides of the first fin; and forming a high-K dielectric layer on the gate dielectric layer and on at least three sides of the second fin; and forming a gate electrode on the ferroelectric layer and on the high-K dielectric layer. The first fin includes a channel region having a first width. The second fin includes a channel region having a second width. The ferroelectric layer is spaced from the first fin and the first and second spacers by the gate dielectric layer. The ferroelectric layer is spaced from the second fin and the third and fourth spacers by the gate dielectric layer.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first fin on a substrate, the first fin including a channel region having a first width;
   forming a second fin on the substrate, the second fin including a channel region having a second width larger than the first width;
   forming first and second spacers on the first fin;
   forming third and fourth spacers on the second fin;
   forming a gate dielectric layer on at least three sides of the first fin and on at least three sides of the second fin;
   forming a ferroelectric layer having a first thickness on the gate dielectric layer;
   annealing the ferroelectric layer;
   thinning a portion of the ferroelectric layer that is on the first fin to a second thickness smaller than the first thickness; and
   removing a portion of the ferroelectric layer that is on the second fin.

2. The method of claim 1, further comprising:
   forming a first gate electrode on the portion of the ferroelectric layer that is on the first fin; and
   forming a second gate electrode on the second fin.

3. The method of claim 1, further comprising:
   forming a dielectric layer on the gate dielectric layer; and
   removing a portion of the dielectric layer that is on the first fin, wherein
   the forming of the ferroelectric layer including forming the ferroelectric layer on a portion of the dielectric layer on the second fin.

4. The method of claim 3 wherein the dielectric layer is a high-K dielectric layer.

5. The method of claim 1 wherein the first width is less than or equal to 50 nanometers, and the second width is greater than or equal to 100 nanometers.

6. The method of claim 1 wherein the first thickness is greater than 5 nanometers, and the second thickness is less than or equal to 5 nanometers.

7. The method of claim 1, further comprising:
   forming an interlayer dielectric on the first, second, third, and fourth spacers.

8. The method of claim 1, further comprising:
   forming first source and drain regions in the first fin, the first source and drain regions being aligned with the first and second spacers, respectively; and
   forming second source and drain regions in the second fin, the second source and drain regions being aligned with the third and fourth spacers, respectively.

9. A method, comprising:
   forming a fin on a substrate;
   forming a dielectric layer on the substrate, the fin extending through the dielectric layer;
   forming first and second spacers on the fin;
   forming a gate dielectric layer on the dielectric layer and on at least three sides of the fin;
   forming a ferroelectric layer having a first thickness on the gate dielectric layer;
   annealing the ferroelectric layer;
   thinning the ferroelectric layer to a second thickness that is smaller than the first thickness; and
   forming a gate electrode on the ferroelectric layer.

10. The method of claim 9 wherein the first thickness is greater than 5 nanometers, and the second thickness is less than or equal to 5 nanometers.

11. The method of claim 9, further comprising:
    forming source and drain regions in the fin, the source and drain regions being aligned with the first and second spacers, respectively.

12. The method of claim 11 wherein a channel width between the source and drain regions is less than or equal to 50 nanometers.

13. The method of claim 9 wherein a portion of the gate dielectric layer, a portion of the ferroelectric layer, and a portion of the gate electrode are positioned between the first and second spacers.

14. The method of claim 9 wherein the ferroelectric layer is spaced from the fin and the first and second spacers by the gate dielectric layer.

15. The method of claim 9 wherein the fin is positioned between the substrate and the first and second spacers.

16. A method, comprising:
    forming a fin on a substrate;
    forming source and drain regions in the fin;
    forming a dielectric layer on the substrate, the fin extending through the dielectric layer;
    forming first and second spacers on the fin, the source and drain regions being aligned with the first and second spacers, respectively;
    forming a gate dielectric layer on the dielectric layer and on at least three sides of the fin;
    forming a second dielectric layer on the gate dielectric layer;
    forming a ferroelectric layer having a first thickness on the second dielectric layer; and
    forming a gate electrode on the second dielectric layer.

17. The method of claim 16 wherein a portion of the gate dielectric layer, a portion of the ferroelectric layer, and a portion of the gate electrode are positioned between the first and second spacers.

18. The method of claim 16 wherein the ferroelectric layer is spaced from the fin and the first and second spacers by the gate dielectric layer.

19. The method of claim 16 wherein the fin is positioned between the substrate and the first and second spacers.

20. The method of claim 16 wherein a channel width between the source and drain regions is greater than or equal to 100 nanometers.

* * * * *